United States Patent
Yuan

(10) Patent No.: US 6,317,070 B1
(45) Date of Patent: Nov. 13, 2001

(54) FLOATING-POINT ANALOG-TO-DIGITAL CONVERTER

(75) Inventor: Jiren Yuan, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/376,012

(22) Filed: Aug. 18, 1999

(30) Foreign Application Priority Data

Aug. 20, 1998 (SE) ................................. 9802787-3
May 4, 1999 (SE) ................................. 9901624-8

(51) Int. Cl.[7] .................................................. H03M 1/12
(52) U.S. Cl. ............................................ 341/155; 341/124
(58) Field of Search ..................................... 341/155, 141, 341/139, 122, 124

(56) References Cited

U.S. PATENT DOCUMENTS

| | | | |
|---|---|---|---|
| 4,449,120 | * | 5/1984 | Rialan et al. ................ 340/347 |
| 4,774,474 | * | 9/1988 | Beauducel et al. ................ 330/129 |
| 4,990,913 | * | 2/1991 | Beauducel ................ 341/139 |

* cited by examiner

*Primary Examiner*—Peguy JeanPierre
(74) *Attorney, Agent, or Firm*—Burns, Doane, Swecker & Mathis, L.L.P.

(57) ABSTRACT

The demand on very high resolution A/D converter can be eliminated by using the invented floating-point A/D converter when the resolution is merely used for covering the signal dynamic range rather than the quantization accuracy. This can be achieved by producing m amplified analog signals with amplifications $2^{(i-1)k}$ where k=constant and i=1, 2, . . . m. The largest linearly amplified signal will be selected by a logic circuit (after sampling) and converted into an n-bit digital data code by an A/D converter. In the same time, the logic circuit produces an m-bit logic flag code. The n-bit data code (u), the m-bit logic flag code (v) and the constant k are combined to form a final digital output $uv^k$ with $n+(m-1)k$ bits. In this way, the resolution and dynamic range can be designed independently. Unlike the know logarithmic amplifier solution, the floating-point A/D converter give a linear digital code output directly without using any look-up table. For large and small signals, the effective resolutions are kept constant (or quasi-constant to be accurate). It is also very useful to work with a small input range imposed by a low power supply voltage since its virtual input range is much larger than the actual one. As an A/D converter, its accuracy distribution along the signal amplitude is more rational, an advantage similar to that of a floating-point number representation.

20 Claims, 5 Drawing Sheets

[6.1]: Amplifier stage    [6.2]: Coupling capacitor

FLOATING-POINT ANALOG-TO-DIGITAL CONVERTER

This application claims priority under 35 U.S.C. §§119 and/or 365 to 9802787-3 and 9901624-8 filed in Sweden on Aug. 20, 1998, and May 4, 1999, respectively; the entire content of which is hereby incorporated by reference.

This invention relates to the kind of analog-to-digital (A/D) converters. The invention relates particularly to A/D converters with a wide dynamic range,

BACKGROUND

The input range of an A/D converter must be designed in such a way that the peak input signal is reliably covered. It means that when (1) the signal amplitude fluctuates in a very large dynamic range, (2) the quantization accuracy must be kept for the smallest signal and (3) the signal needs to be kept linear, a very high resolution A/D converter has to be used. In maw cases, high resolution is merely designed for covering the signal dynamic range rather than the quantization accuracy. For example, in order to obtain a 60 dB signal dynamic range and a minimum 6-bit quantization accuracy, the resolution must be at least 16-bit, a very high demand at high speed. Actually, in such a converter, the resolution for large signals are unnecessarily high. It would be more rational, if the converter offers the same resolution for large end small signals within this range.

Moreover, the trend of low power and low voltage reduces the actual input range, which makes the design of a wide dynamic range A/D converter more difficult since non-ideal factors like component mismatch and amplifier offset are not reduced with the reduction of supply voltage. In such a case, it is very difficult to satisfy large dynamic range with high resolution.

Traditionally, a logarithmic amplifier is used for compressing the signal amplitude in order to expand dynamic range. The accuracy, however, will be seriously degraded for a large compression ratio due to difficulties in designing the logarithmic amplifier. In order to produce linear digital output code a look-up table is usually used, which has to be matched with the amplifier precisely.

The demand on very high resolution A/D converter can be eliminated by the invented floating-point A/D converter, when the resolution is merely needed for covering signal dynamic range. Unlike the known logarithmic amplifier solution, the floating-point A/D converter gives a linear digital output directly. For large and small signals, the effective resolutions are kept constant (or quasi-constant to be accurate), similar to a floating-point number representation. Its resolution and dynamic range can be designed independently, which makes this invention very useful and flexible.

SUMMARY

The object of the invention is to provide a new approach to a wide dynamic range A/D converter in which dynamic rang and resolution are handled separately so high resolution imposed by wide dynamic range can be avoided.

The object is achieved by the invented floating-point A/D converter. Instead of using a single input amplifier, more than one amplifiers are used to produce multiple analog signals covering a wide dynamic range. Their amplifications are weighted in such a way that there is always one amplifier giving a linearly amplified analog signal with a suitable amplitude which will be selected and converted to digital output. The unused signals are either too small or too large (non-linear or saturated). If the amplification ratios are known, e. g. binary, it will be possible to combine the results to form a final digital output. A normal A/D converter is used for converting only the selected signals, which gives a constant resolution to different input signals. Since only the largest linearly amplified signals are sampled and converted, the reachable accuracy is higher than that of a normal A/D converter.

DETAILED DESCRIPTION

Figure 1:
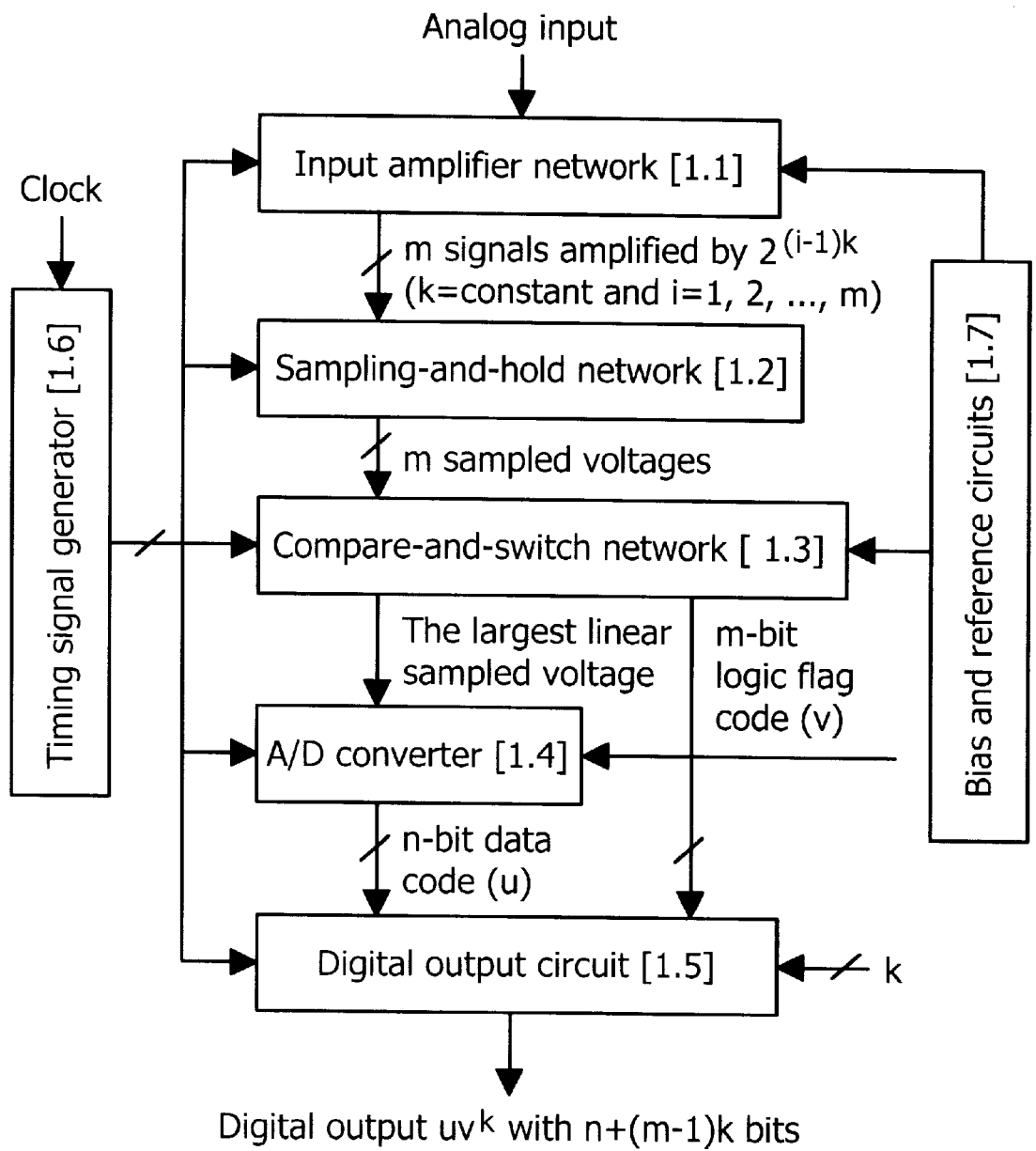
FIG. 1 shows the block diagram of a floating-point A/D converter (1).

1. In FIG. 1, the block diagram of a floating-point A/D converter is shown. The input amplifier network [1.1] amplifies the input analog signal and produces m amplified signals with amplifications $_2(i-1)k$ respectively, where k=constant and i=1, 2, ..., m. When k=1 or 2. the signal amplitudes are weighted in binary or quaternary. Among them, part may be non-linear or saturated. Depending on he input signal amplitude, the largest linearly amplified signal will appear at one of the signal outputs. The amplified signals may be delay-balanced or delay-skewed depending on the type of input amplifier network. Delay-balanced signals can be produced by an amplifier tree or array. Delay skewed signals can be produced via amplifier chain by taking signals from successive amplifier stages. The m amplified signals are fed to the sampling-and-hold (S/H) network [1.2] to produce m sampled voltages. In the ease of delay-balanced signals, the sampling will be performed by m parallel S/H circuits. In the case of delay-skewed signals, the sampling will be performed by S/H circuits using time-skewed sampling clocks at precisely matched time moments. In order to align the time, the delay-skewed voltages can be deskewed either by resampling or by using i S/H circuits for signal i respectively, where i=1, 2, ..., m. The timing signal generator [1.6] produces time-balanced (for delay-balanced signals) or time-skewed (for delay-skewed signals) sampling clocks for the S/H network. The compare-and-switch network [1.3] compares the m sampled voltages with a reference voltage $V_r = q^V\text{max}/2^k$ where $^V\text{max}$ is the maximum linear voltage output of the amplifiers, and q ($\leq 1$) is a safety coefficient. It means that $V_r$ does not need to be precise as long as $q \leq 1$. However, the larger q, the more utilization of amplifier linear range. When k=1 and q=1, $V_r = ^V\text{max}/2$, and the linear range is fully utilized. The largest linear sampled voltage ($\leq q^V$max) will be selected by a logic circuit. In the same time, the compare-and-switch network [1.31] produces an m-bit logic flag code like 00001000 for m=8. The "1" in the logic flag coda indicates the position of the selected voltage. In this example, it comes from anplifier 5 with am amplification $2^{(5-1)k}$. The largest linear sampled voltage is then converted to an n-bit digital data code by an A/D converter [1.4]. The digital output circuit [1.5] combines the n-bit data code (u), the m-bit logic flag code (v) and the constant k to produce a final output $uv^k$ with n+(m-1)k bit. If k is an integer, only shifting operations are involved, which greatly simplifies the circuit. The timing signal generator [1.6] also produces control signals for other blocks. The bias and reference circuits [1.7] produce bias voltages and/or currents which may be necessary for amplifiers and reference voltages for the compare-and-switch network [1.3] and the A/D converter [1.4]. Power distribution is not shown in the diagram.

Figure 2:
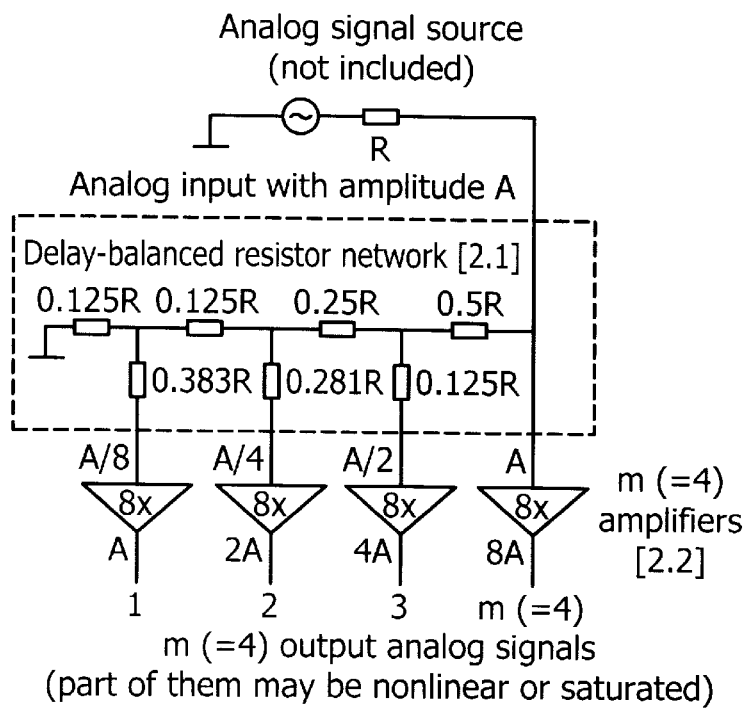
FIG. 2 shows arrangement 1 of a delay-balanced input amplifier network [2] exampled with m=4 and k=1.

2. In FIG. 2, arrangement 1 of a delay-balanced input amplifier network [2] exampled with m=4 and k=1 in shown. It is formed by a delay-balanced resistor network [2.1] and identical amplifiers [2.2]. The resistor network [2.1] serves as a matching load for the analog signal source with an output resistance R and an output amplitude A which is not included in this invention. The resistor network [2.1] divides the input analog signal into m (=4) analog signals by ratios $2^{-(m-i)}$, where i=1, 2, 3 and 4 in this example, with resulting amplitudes A/8, A/4, A/2 and A respectively, and balances the delays of the m (=4) signal paths. Under the condition of identical input capacitances of the amplifiers, the resistor values normalized by R are shown in FIG. 2. Identical amplifiers [2.2] amplify the m (=4) weighted signals with an amplification $2^{(m-i)}$, i, =8. The final outputs are delay-balanced analog signals with amplitudes $A2^{(i-1)}$ where i=1, 2, 3 and 4 in this example, i. e. A, 2A, 4A, and 8A, respectively. Note that part of them may be non-linear or saturated. Of course, arrangement 1 [2] can have m other than 4 by redesigning the resistor network. In this arrangement, amplifiers are kept identical to obtain a good match, and the amplification weighting is done by passive components to minimize errors. As long as all amplifiers are matched, the deviation in absolute amplification is unimportant.

Figure 3:
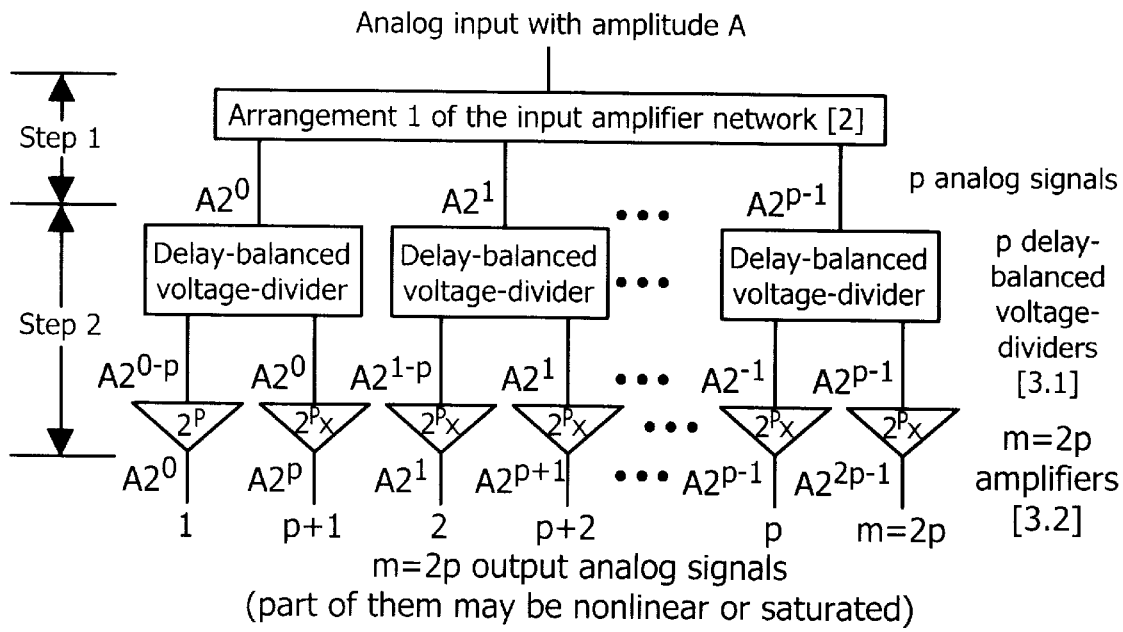
FIG. 3 shows arrangement 2 of a delay-balanced input amplifier network [3] exampled with k=1.

3. In FIG. 3, arrangement 2 (a two-step arrangement) of a delay-balanced input amplifier network [3] exampled with k=1 is shown. It follows the principle of keeping components as identical as possible. Arrangement 1 [2] is used as step 1, assuming that it produces p analog signals with amplitudes $A2^0, A2^1, \ldots, A2^{p-1}$. In step 2, the p signals are first divided into m (=2p) signals by p identical delay-balanced voltage-dividers [3.1] respectively. Each of them gives two delay-balanced outputs, one with amplitude unchanged and the other with amplitude weighted by $2^{-P}$. The m (=2p) signals are then amplified by m identical amplifiers [3.2] with an amplification $2^P$ respectively. The final outputs are m (=2p) analog signals with amplitudes $A2^{(i-1)}$ where i=1, 2, ..., m (=2p). This arrangement avoids large dividing ratios of passive voltage dividers for a large m.

Figure 4:
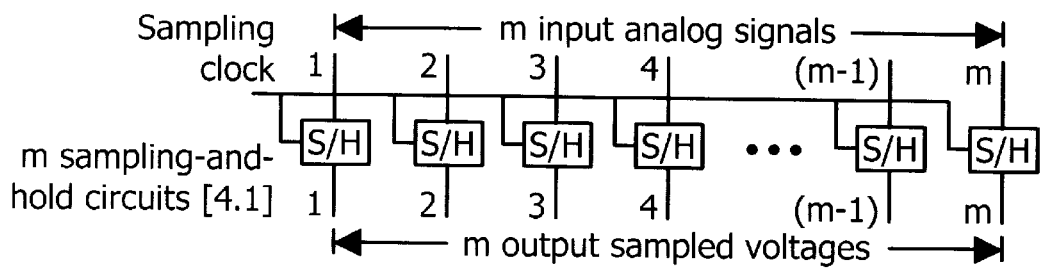
FIG. 4 shows a time-balanced sampling-and-hold network [4].

4. In FIG. 4, a time-balanced sampling-and-hold (S/H) network [4] is shown. It comprises m identical S/H circuits which periodically sample them amplified signals coming from the input amplifier network [1.1] and hold the m sampled voltages for further comparison, controlled by the sampling clock(s) coming from the timing signal generator [1.6].

Figure 5:
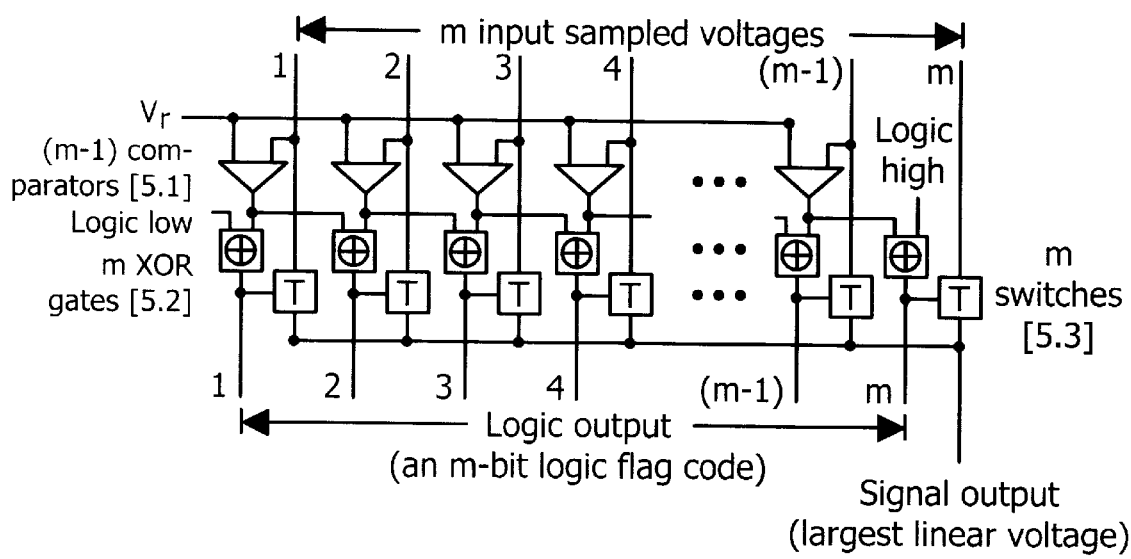
FIG. 5 shows a compare-and-witch network [5].

5. In FIG. 5, a compare-and-switch network [5] is shown The m sampled voltages are respectively connected to the inputs of m identical switches [5.3]. In the same time, sampled voltages. 1-to-(m−1) are compared with a reference voltage $v_{r=q}{}^V$max/$2^k$ by m−1 comparators [5.1]. Voltage m (the largest one) is not compared. In the following, the voltage numbers are used to number corresponding comparators [5.1], XOR gates [5.2] and switches [5.3]. The inputs of XOR gate i are connected with the outputs of comparators i−1 and i, where i=2, 3 , . . . , (m−1). For XOR gate 1, one of its inputs is connected with logic low while the other is connected with the output of comparator 1. For XOR gate m, one of its inputs is connected with logic high while the other is connected with the output of comparator m−1. There will be only one switch being turned on to switch the largest linear sampled voltage to the signal output, where the output of the XOR gate is logic high. Switch m will be kept on when all sampled voltages are smaller than $v_r$. In this way, the largest linear sampled voltage will be always selected. When the input analog signal is out of the dynamic range, i. e. all sampled voltages are larger than $V_{max}$ (becoming non-linear or saturated), switch 1 will be kept on. The outputs of m XOR gates form an m-bit logic flag code fed to the logic output.

Figure 6:
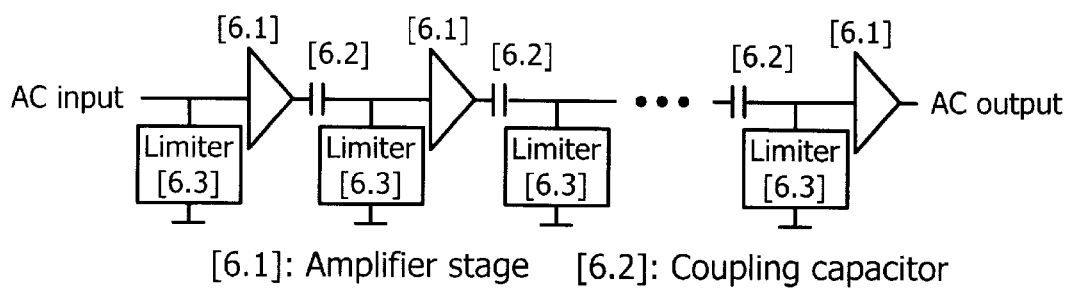
FIG. 6 shows a low-offset constant-delay AC amplifier [6].

6. In FIG. 6, a low-offset constant-delay AC amplifier [6] is shown, which can be for example used for amplifying RF and IF radio signals. Note that both low-offset and constant-delay are important for amplifiers used in the floating-point A/D converter [1]. The low offset is achieved by the coupling capacitor [6.2] arrangement between amplifier stages [6.1], which stops the propagation of DC offset. The constant delay is achieved by the limiter [6.3] arrangement which prevents the amplifier stages from overvoltage as overvoltage causes additional delays for the signal falling slopes. Moreover, the inputs of amplifier stages are grounded via the limiter with small (in unlimiting state) or large (in limiting state) conductance so their DC potentials are kept at ground.

Figure 7:
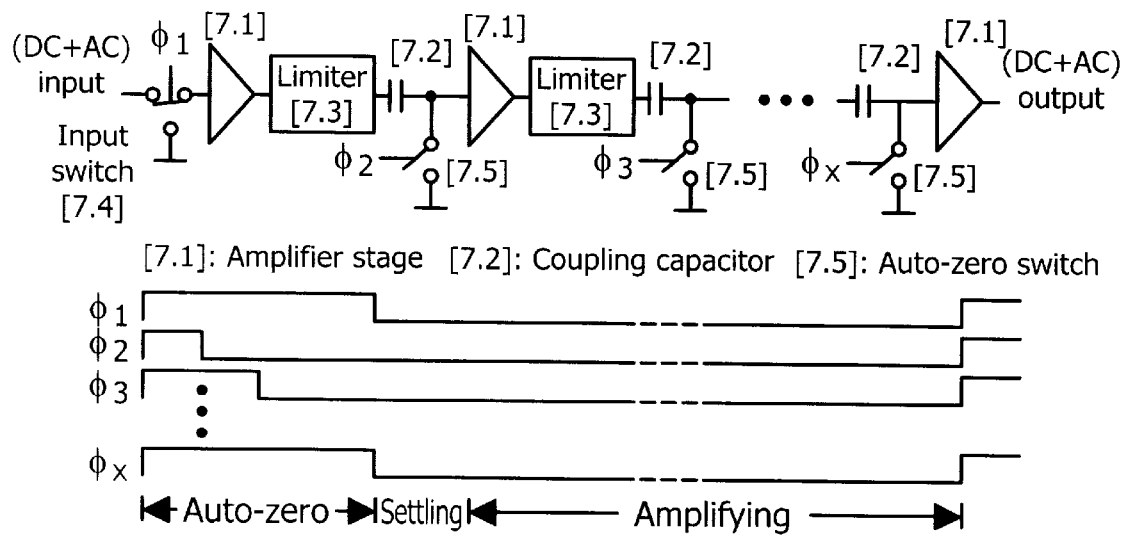
FIG. 7 shows a low-offset constant-delay auto-zeroed amplifier [7].

7. In FIG. 7, a low-offset constant-delay auto-zeroed amplifier [7] is shown. It enables the floating-point A/D converter to convert signals with both DC and AC components. The constant delay is achieved by the limiter [7.3] arrangement which limits the output amplitudes of the amplifier stages [7.1] to prevent themselves as well as their succeeding stages from overvoltage. Each limiter is placed before the coupling capacitor [7.2] since during amplifying phase the inputs of amplifier stages must be kept floating. The low offset is achieved by the auto-zero arrangement. In the beginning of auto-zero phase, all inputs of amplifier stages are switched to ground by the input switch [7.4] controlled by clock $\phi_1$ and the auto-zero switches [7.5] controlled by clocks $\phi_2$-to-$\phi_x$. Afterwards, from stage 2 to the last stage, the inputs of all stages are successively switched to floating. The successive switching can greatly reduce the impact of charge-feed-through. When all these inputs become floating, the input of stage 1 is switched to the analog input. So far, it is very similar to an auto-zeroed comparator which produces only a logic output. The point is that after the settling phase, this amplifier can possibly amplify both DC and AC signals with a low-offset until the charges on the floating inputs change significantly due to leakage.

Figure 8:
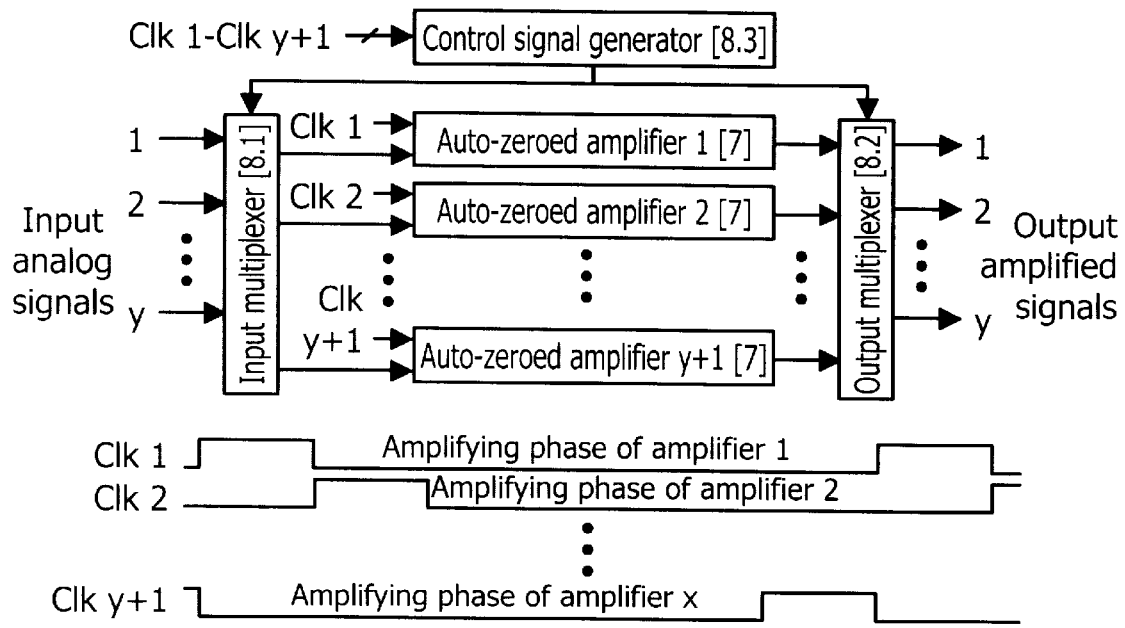
FIG. 8 shows an arrangement of using y+1 auto-zeroed amplifies for amplifying y analog signals [8].

8. In FIG. 8, an arrangement of using y+1 auto-zeroed amplifiers [7] for amplifying y analog signals [8] is show. Since an auto-zeroed anplifier needs an auto-zero phase in which it can not amplify any signal, the least number of amplifiers for amplifying signals is y+1. This is achieved by skewing the timing for the y+1 auto-zeroed amplifiers with the time of auto-zero phase plus settling phase successively so there will be y amplifiers available for amplifying always. The input multiplexer [8.1] the output multiplexer [8.2] will disconnect the amplifier which is not available for amplifying from the y inputs and y outputs by control signals coming from the control signal generator [8.3]. In the same time, the available amplifiers are connected to the y inputs and y outputs. The larger y, the more complex multiplexers. When y=1, it results in two amplifiers shared by one input and one output, using simplest multiplexers.

ADVANTAGES

The following advantages are achieved with the invented floating-point A/D) converter:

1. Independent and Wide Dynamic Range

It is achieved by the multiple amplifiers with a wide range of amplifications to treat small and large signals differently. In such a way, dynamic range can be independent of resolution so high resolution imposed by wide dynamic range becomes Unnecessary. As no sampling or subtraction is involved before the Signal becomes large enough the accuracy is maintained, which makes a wide dynamic range possible.

2. Direct Linear Digital Code Output

Unlike the known logarithmic amplifier solution, the floating-point A/D converter gives linear digital code output directly without using any look-up table.

3. Less Sensitive to Process Variations

As amplifications are weighted by passive network(s), and active parts are kept identical, it is less sensitive to process variation for a good implementation.

4. Flexibility

As the dynamic range and the resolution can be independently designed, it is rather flexible. For example, a very wide dynamic range can be combined with just one-bit resolution, and vice versa.

5. Superior to an Automatic Gain Controlled System

In the case of using automatic gain control, which is difficult for fast changing signals, to expand dynamic range and/or to fully utilize the A/D converter input range, the resulting resolutions for large and small signals are the same. Therefore, it can be perfectly replaced by the floating-point A/D converter with higher performance.

6. Low Voltage Supply Application

As its virtual input range can be much larger than the actual one, the floating-point A/D converter is suitable to work with a small input range imposed by a low power supply voltage.

7. Rational Accuracy Distribution

Among different A/D converters, its accuracy distribution along the signal amplitude is more rational, an advantage similar to that of a floating-point number representation.

The amplifier DC-offsets seriously limit the achievable accuracy. For a radio IF signal, AC-coupling can effectively remove the DC-offsets as presented in [7]. It is, however, not applicable for a universal ADC. Over-voltage causes another kind of problem. The amplifier saturated by an over-voltage input will seriously distort and delay the signal during its recovery period, leading to large sampling errors. A limiter can be used at the input to prevent the amplifier from over-voltage [7]. It is, however, difficult to eliminate the problem completely. The method introduced below is different from above approaches. It solves the two problems simultaneously and "completely" (at least in principle), see FIG. 9 for a proposed amplifier and S/H channel.

Figure 9:
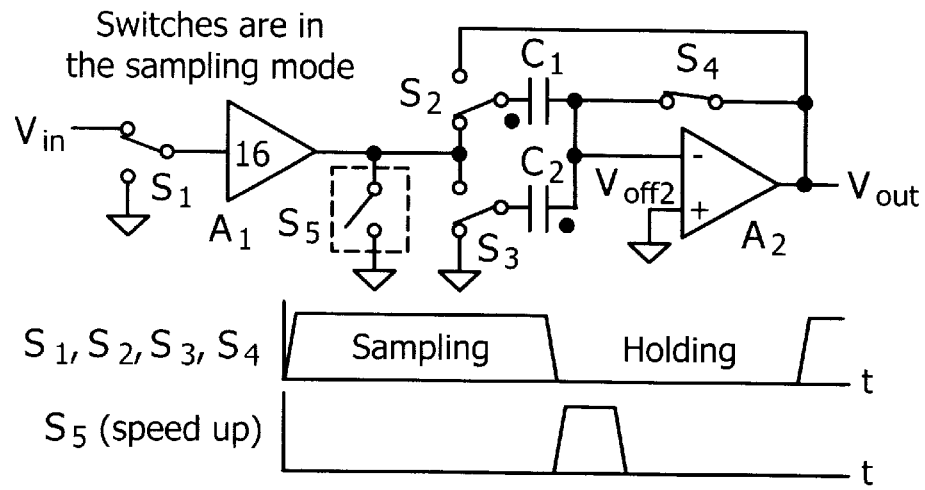
FIG. 9 shows a proposed amplifier and S/H each channel.

In FIG. 9, $C_1$ equals $C_2$ nominally. In the end of sampling phase, the voltages are $$V_{C1} = 16V_{in} + 16V_{off1} - V_{off2} \quad (1)$$

$$V_{C2} = V_{off2} \quad (2)$$

$$V_{out} = V_{off2} \quad (3)$$

where $V_{off1}$ and $V_{off2}$ are input-referred offset voltages of $A_1$ and $A_2$. $S_5$ is an optional switch, temporarily connecting the output of $A_1$ to ground in the beginning of holding phase to speed up the recovery of $A_1$ from saturation. During the holding phase, the input of $A_2$ should still be $V_{off2}$. Since $C_1 = C_2$, we have $$V_{out} = 16(V_{in} + V_{off1}) - V_{off2} - 16V_{off1} + V_{off2} = 16V_{in} \quad (4)$$

As a result, the offset voltages of both $A_1$ and $A_2$ are cancelled. Note that, $S_4$, is the only switch sensitive to clock and charge feed-through. All other switches just connect well-defined voltages and do not affect the accuracy. Therefore, this is quite feasible. Moreover, since the input of $A_1$ is connected to the signal ground after each sampling phase, the amplifier input voltage always starts from minimum, which effectively eliminates the over-voltage delay problem. The speed, however, will be affected by the settling time of $A_1$. In order to increase speed, two amplifiers ($A_1$ and $A_1'$) can be used for each channel, see FIG. 10.

Figure 10:
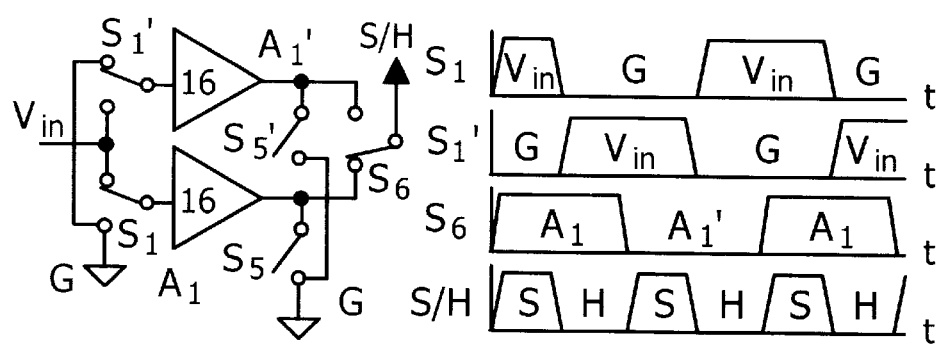
FIG. 10 shows two parallel amplifiers used in each channel.
Figure 11:
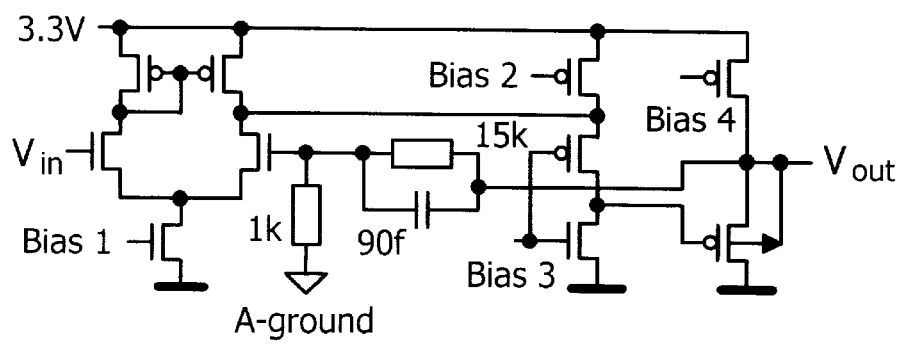
FIG. 11 shows a low power amplifier.

In FIG. 10, $A_1$ and $A_1'$ will gain more time for signal settling. When they are switched to the holding phase, $S_5$ or $S_5'$ will help them to quickly come back to the signal ground (see FIG. 9 for timing). The power of $A_1$ and $A_1'$ should be kept low to limit the total power consumption. A low power amplifier has been designed for this purpose, see FIG. 11, and an input amplifier network (base on FIG. 2) has been implemented in a 0.35 μm CMOS process.

What is claimed is:

1. An analog-to-digital converter, comprising an input amplifier network including a plurality of amplifiers for amplifying an analog input signal and generating multiple analog signals in different ranges, wherein the amplifiers are weighted in a way that only one amplifier generates a largest linearly amplified analog signal, selection means for selecting said largest linearly amplified analog signal, and A/D converter means for converting said largest linearly amplified analog signal into a digital output signal.

2. An analog-to-digital converter according to claim 1, further comprising:

a. the input amplifier network, comprising an input node or, if it is differential, a pair of nodes, to which the input analog signal is connected, a number of output nodes, the plurality of amplifiers for amplifying the input analog signal and producing a number of delay-balanced or delay-skewed signals fed to the output nodes respectively, with amplifications $2^{(i-1)/k}$ where k is constant and i=1, 2, ..., m, so that within a dynamic range for large and small input analog signals there is always a linearly amplified signal having a largest preferable amplitude available at one of the output nodes;

b. a sampling-and-hold network, comprising a number of signal input nodes, to which the amplified signals are connected, in the case delay-balanced input signals, one clock input node, to which a sampling clock is connected; in the case of delay-skewed input signals, a number of clock input nodes, to which a number of time-skewed sampling clocks are connected, a number of output nodes; in the case of delay-balanced input signals, a number of S/H circuits for sampling the amplified signals and holding sampled voltages at the output nodes, respectively, under the control of the sampling clock; in the case of delay-skewed input signals, a number of S/H circuits for sampling the amplified signals at precisely matched time moments under the control of the time-skewed sampling clocks and a deskewing circuit for producing time-aligned sampled voltages fed to the output nodes, respectively;

c. a compare-and-switch network, comprising a number of input nodes, to which the sampled voltages are connected, respectively, one or more than one reference input node(s), to which one or more than one reference voltage(s) is or are connected, a signal output node or, if it is differential, a pair of signal output nodes, a logic output node or a number of logic output nodes, a number of comparators for comparing the sampled voltages with the reference voltage(s), a logic circuit for identifying the sampled voltage(s) for the largest linearly amplified analog signal by examining the comparator outputs and producing a logic flag code fed to the logic output node(s) which will be used both internally and externally, a number of switches controlled by the logic flag code for switching only the identified sample voltage(s) to the signal output node (s);

d. an A/D converter, comprising a signal input node or a pair of signal input nodes if differential to which the identified sampled voltage(s) is or are connected, one or more than one reference input node(s) to which reference voltage(s) for A/D conversion is or are connected, one or more than one clock input nodes to which a clock or a number of clocks is or are connected, a digital output node or a number of digital output nodes, an A/D converter body to digitize the identified sampled voltage(s) and to produce a digital data code fed to the digital output node(s) under the control of the clock(s);

e. a digital output circuit, comprising digital input node or a number of digital input nodes, to which the digital data code is connected, a logic input node or a number of logic input nodes, to which the logic flag code is connected; optionally, a constant input node or a number of constant input nodes, to which a constant code k is or are connected, one or more than one clock input node(s), to which a clock or a number of clocks is or are connected, a digital output node or a number of digital output nodes a circuit combining the data code (u), which is n bits long, the logic flag code (v), which is m bits long, and the constant code k, and producing a final digital output $uv^k$ with n+(m−1) k bits fed to the digital output node(s) under the control of the clock(s);

f. a timing signal generator, comprising one or more than one clock input node(s), to which one or more than one input clock(s) is or are connected, a number of output nodes, timing signal generating circuits for producing and feeding timing signals to the A/D converter via the output nodes;

g. bias and reference circuits, comprising bias circuit(s) for biasing the amplifiers with additional connecting nodes, reference voltage generating circuit(s) for generating and feeding reference voltage(s) to the compare-and-switch network; and h. a power supply or a number of power supplies for activating said analog-to-digital converter.

3. An analog-to-digital converter according to claim 2, wherein said input amplifier network, using single-ended or differential signal(s), comprises:

a. an input node, to which the input analog signal is connected;

b. m output nodes;

c. a delay-balanced resistor network for serving as a matching load for the input analog signal source, for dividing the input analog signal into m analog signals with ratios $2^{-(m-i)k}$ where i=1, 2, . . . , m, and k is a constant and balancing the delays of different signal paths under load conditions; and d. m identical amplifiers for amplifying the m analog signals with an amplification $2^{(m-i)k}$ and feeding the amplified signals to the m output nodes, respectively.

4. An analog-to-digital converter according to claim 2, wherein said input amplifier network comprises;

a. an input node, to which the input analog signal is connected;

b. m output nodes;

c. the input amplifier network for amplifying the input analog signal and producing p amplified signals;

d. p identical delay-balanced voltage-dividers, each with one input and two outputs with ratios 1 and $2^{-pk}$, respectively, dividing the p analog signals into m=2p analog signals; and e. m identical amplifiers for amplifying the m analog signals with an amplifications $2^{pk}$, and feeding the m amplified signals to the m output nodes.

5. An analog-to-digital converter according to claim 2, wherein said compare-and-switch network, using single-ended or differential signal(s), comprises:

a. m input nodes, to which the m sampled voltages coming from the S/H network, are connected respectively;

b. one of two reference voltage input nodes(s), to which reference voltage(s) $V_r=qV_{max}/k^k$ or $\pm V_r=\pm qV_{max}/2^k$ is or are connected, wherein $V_{max}$ or $\pm V_{max}$ is or are the maximum amplifier linear output voltage(s), and q is a safety coefficient;

c. a signal output node;

d. one or m logic output node (s);

e. m−1 comparators for comparing sampled voltages 1-to-(m−1) with reference voltage(s) $V_r$ or $\pm V_r$ and giving a logic true output if the sampled voltage is larger than $V_r$ or out of the $\pm V_r$ range;

f. m two-input XOR gates with a logic low and the output of comparator 1 connected to the inputs of XOR gate 1, with the outputs of comparators i−1 and i connected to the inputs of XOR gate i, where i−2, 3, . . . (m−1), with the output of comparator m−1 and a logic high connected to the inputs of XOR gate m and with the outputs of the m XOR gates as an m-bit logic flag code fed to the logic output node(s); and g. a switch network to connect the signal output node with one of the sampled voltages where the output of the XOR gate is logic high.

6. An analog-to-digital converter according to claim 2, wherein said digital output signal comprises:

a. one or n digital input node(s), to which the n-bit digital data code is connected;

b. one or m logic input node(s), to which the m-bit logic code is connected;

c. a constant input node or a number of constant input nodes, to which the integer constant code k (=1, 2, . . . ) is connected;

d. one or more than one clock input nodes, to which a clock or a number of clocks is or are connected;

e. a digital output node or a number of digital output nodes; and f. one or two multiplier(s) for calculating $v^k$ by multiplying v by v with k times, and then multiplying u by $v^k$ to produce a final digital output $uv^k$ with n+(m−1)k bits fed to the output node(s), in which only simple shifting operations are involved.

7. An analog-to-digital converter according to claim 2, wherein said delay-balanced input amplifier comprises a low offset constant-delay AC amplifier, which comprises;

a. an input node to which the input analog signal is connected;
   b. an output node;
   c. a number of amplifier stages with the input of the first stage connected to the input node and the output of the last stage connected to the output node;
   d. a number of coupling capacitors respectively connected between the amplifier stages in order to stop the propagation of DC offsets; and
   e. a number of limiters connecting the inputs of the amplifier stages to ground, which limits the input amplitudes for preventing the stages from overvoltage and offers DC paths for the inputs to ground always.

8. An analog-to-digital converter according to claim 2, wherein said delay-balanced input amplifier comprises a low offset constant-delay auto-zeroed amplifier, which comprises:

a. an input node, to which the input analog signal is connected;
   b. a number of clock nodes respectively connected with clocks $\Phi_1$-to-$\Phi_x$, in which all rising edges are synchronized, wherein the falling edges of $\Phi_2$-to-$\Phi_x$ are successively delayed, the falling edges of $\Phi_1$ and $\Phi_x$ are synchronized, and the low phases of $\Phi_1$-to-$\phi_x$ are used for the amplifier in order to amplify the input analog signal;
   c. an output node;
   d. a number of amplifier stages, 1-to-x, with the output of stage x connected to the output node;
   e. a number of limiters, 1-to-(x−1), respectively connected at the outputs of stages 1-to-(x−1) for preventing stages 1-to-x from overvoltage;
   f. a number of coupling capacitors, 1-to-(x−1), respectively connected between the output of limiter i and the input of stage i+1 where i=1, 2, . . . , (x−1);
   g. an input switch connecting the input of stage 1 to ground when $\Phi_1$ is high or to the input node when $\Phi_1$ is low; and
   h. a number of auto-zero switches, respectively connecting the inputs of stages 2-to-x to ground when $\Phi_2$-to-$\Phi_x$ are high or keeping them floating when $\Phi_2$-to-$\Phi_x$ are low.

9. An analog-to-digital converter according to claim 2, wherein said delay-balanced input amplifier comprises y+1 auto-zeroed amplifiers, which comprises:

a. y input node(s), to which y input analog signal(s) is or are connected;
   b. y+1 clock nodes, to which clocks 1-to-(y+1) with equal periods $T_c$ and high phases $T_c/(y+1)$, successively skewed by $T_c/(y+1)$, are connected respectively;
   c. y output node(s);
   d. y+1 low offset constant-delay auto-zeroed amplifiers with the time of auto-zero phase plus settling phase equal to or larger than $T_c/(y+1)$;
   e. a control signal generator for producing control signals from clocks 1-to-(y+1); and
   f. an input multiplexer with its y input(s) connected to the y input node(s) and y+1 outputs connected to the y+1 amplifier inputs respectively, by which the y input analog signal(s) is or are always switched to the input (s) of y amplifying one(s) among y+1 amplifiers under the control of the control signals;
   g. an output multiplexer with its y+1 inputs connected to the y+1 amplifier outputs and y output(s) connected to the y output node(s) respectively, by which the output (s) of y amplifying one(s) among y+1 amplifiers are always connected to the y output node(s) under the control of the control signals.

10. A method for providing A/D conversion of an analog input signal, comprising the steps of:

inputting the analog input signal into a resistor network to produce a plurality of analog signals with different amplitudes;
   amplifying the plurality of analog signals in a plurality of amplifiers to produce a plurality of amplified signals;
   inputting the plurality of amplified signals into a sampling-and-hold network to produce a plurality of sampled voltages;
   comparing the plurality of sampled voltages with a first reference voltage;
   selecting one of the first plurality of sampled voltages, wherein the selected sampled voltage is the voltage that is the closest to but greater than the first reference voltage; and
   converting the selected sampled voltage into a digital output signal.

11. The method of claim 10, wherein a logic circuit is used to select the selected sampled voltage.

12. The method according to claim 11, wherein said logic circuit comprises a plurality of comparators, XOR gates and switches.

13. The method according to claim 10, wherein the smallest voltage of the plurality of sampled voltages is selected if at all of the first plurality of sampled voltages are greater than the reference voltage.

14. The method according to claim 10, further comprising the step of:

comparing said selected sampled voltage with a second reference voltage and selecting another sampled voltage with less voltage if the selected sampled voltage is greater than the second reference voltage.

15. The method according to claim 10, wherein said plurality of amplifiers are substantially matched.

16. A floating point analog-to-digital converter, comprising:

a resistor network for producing a plurality of analog signals with different amplitudes from the input analog signal;
   a plurality of amplifiers for amplifying the plurality of analog signals to produce a plurality of amplified signals;
   a sampling-and-hold network for producing a plurality of sampled voltages from the plurality of amplified signals;
   a logic circuit for comparing at least some of the sampled voltages with a reference voltage and selecting a sampled voltage which is the closest to but greater than the reference voltage; and
   an A/D converter for converting the selected sampled voltage into a digital output signal.

17. The floating point analog-to-digital converter according to claim 16, wherein said logic circuit comprises a plurality of comparators, XOR gates and switches.

18. The floating point analog-to-digital converter according to claim 16, wherein the smallest voltage of the plurality of sampled voltages is selected if all of the first plurality of sampled voltages are greater than the reference voltage.

19. The floating point analog-to-digital converter according to claim 16, wherein the selected sampled voltage is compared with a second reference voltage and another sampled voltage with less voltage is selected if the selected sampled voltage is greater than the second reference voltage.

20. The floating point analog-to-digital converter according to claim 16, wherein said plurality of amplifiers are substantially matched.

* * * * *